(12) United States Patent
Wu et al.

(10) Patent No.: US 7,259,090 B2
(45) Date of Patent: Aug. 21, 2007

(54) COPPER DAMASCENE INTEGRATION SCHEME FOR IMPROVED BARRIER LAYERS

(75) Inventors: Zhen-Cheng Wu, Hsinchu (TW); Yung-Cheng Lu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 45 days.

(21) Appl. No.: 10/834,783

(22) Filed: Apr. 28, 2004

(65) Prior Publication Data

US 2005/0245071 A1    Nov. 3, 2005

(51) Int. Cl.
*H01L 21/4763* (2006.01)
(52) U.S. Cl. .................. 438/627; 257/21.584; 438/653
(58) Field of Classification Search ................ 438/627, 438/629, 653; 257/E21.584
See application file for complete search history.

(56) References Cited

U.S. PATENT DOCUMENTS

| | | | | |
|---|---|---|---|---|
| 6,191,025 | B1* | 2/2001 | Liu et al. .................... | 438/622 |
| 6,191,027 | B1* | 2/2001 | Omura ....................... | 438/627 |
| 6,306,732 | B1* | 10/2001 | Brown ....................... | 438/468 |
| 6,448,654 | B1* | 9/2002 | Gabriel et al. .............. | 257/758 |
| 6,699,783 | B2* | 3/2004 | Raaijmakers et al. ....... | 438/633 |
| 6,919,617 | B2* | 7/2005 | Yamada et al. ............. | 257/635 |
| 2004/0000719 | A1* | 1/2004 | Matsubara et al. ......... | 257/767 |
| 2004/0173910 | A1* | 9/2004 | Usami et al. ............... | 257/762 |

* cited by examiner

*Primary Examiner*—Caridad Everhart
(74) *Attorney, Agent, or Firm*—Tung & Associates

(57) ABSTRACT

A metal filled dual damascene structure with a reduced capacitance contribution and method for forming the same, the method including forming a first metal filled damascene lined with a first metal barrier layer thickness in a first dielectric insulating layer; and, forming a second metal filled damascene lined with a second metal barrier layer thickness overlying the first metal filled damascene in a second dielectric insulating layer.

37 Claims, 3 Drawing Sheets

COPPER DAMASCENE INTEGRATION SCHEME FOR IMPROVED BARRIER LAYERS

FIELD OF THE INVENTION

This invention generally relates to methods for forming semiconductor device integrated circuits including copper damascene interconnects and more particularly to a method for forming copper dual damascenes to reduce signal delay and achieve improved barrier layer performance.

BACKGROUND OF THE INVENTION

Copper metallization is increasingly being used for advanced semiconductor device integrated circuit fabrication including semiconductor features having sub-quarter micron linewidths and high aspect ratios to larger features such as bonding pads. Copper and its alloys have lower resistivity and better electromigration resistance compared to other metals such as, for example, aluminum. These characteristics are critical for achieving device reliability together with higher current densities and increased signal propagation speed. While several processing difficulties related to forming copper semiconductor features have been overcome, several problems remain, including the problem of barrier layer coverage and integrity to prevent copper migration as well as reducing signal delay caused by capacitive contributions of etch stop and barrier layers in a multi-layered integrated circuit.

One increasing problem with prior art methods of forming copper dual damascenes including barrier layers is achieving adequate coverage of the barrier layers over both the via and trench line portions of the dual damascene structure. For example as device critical dimensions shrink below about 1.0 microns and aspect ratios of vias increase to greater than about 4.5, the barrier layer coverage in the trench line portion is increasingly limited by the coverage of the via portion. For example, as the aspect ratio of the via increases to greater than about 3.5, the step coverage of the barrier layer rapidly decreases, especially along the sidewalls of the damascene opening. As a result, the probability for copper migration under moderate temperatures and electrical fields increases to unacceptable values, degrading device performance and reliability.

Moreover, as device sizes decrease the impact of capacitive contributions from barrier layers and etch stop layer increases, creating a tension between the goals of forming reliable and effective copper diffusion barriers and etch stop layers while reducing the capacitive contribution of such layers.

Thus, there is a continuing need for novel semiconductor device integrated circuit manufacturing methods to improve the electrical performance of metal interconnect features including improved etch stop layer and barrier layer integrity and performance while reducing a capacitive contribution to signal propagation delay.

It is therefore among the objects of the invention to provide a method to improve the reliability and electrical performance of metal interconnect features including improved etch stop layer and barrier layer integrity and performance while reducing a capacitive contribution to signal propagation delay, in addition to overcoming other shortcomings of the prior art.

SUMMARY OF THE INVENTION

To achieve the foregoing and other objects, and in accordance with the purposes of the present invention, as embodied and broadly described herein, the present invention provides a metal filled dual damascene structure with a reduced capacitance contribution and method for forming the same.

In a first embodiment, the method includes forming a first metal filled damascene lined with a first metal barrier layer thickness in a first dielectric insulating layer; and, forming a second metal filled damascene lined with a second metal barrier layer thickness overlying the first metal filled damascene in a second dielectric insulating layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to formation of an exemplary copper interconnect structure (feature) such as a dual damascene, it will be appreciated that the process may be equally as well used in forming single damascene structures overlying conductive areas well as thicker and wider structures such as bonding pads and wide trenches overlying conductive areas. Further, it will be appreciated that the metal used to fill the metal interconnect may additionally include tungsten and aluminum as well as copper and alloys thereof.

The method of the present invention is particularly advantageously used in the formation of copper dual damascene features including vias and trench lines for multi-layer semiconductor devices having characteristic dimensions of less than about 0.13 microns. In addition, the method is particularly advantageously used with organo-silicate glass (OSG) based low-K dielectric insulating layers and having a dielectric constant of less than about 3.0 including less than about 2.5, for example from about 2.2 to about 3.0. Further, the term 'copper' will be understood to include copper and alloys thereof.

For example, in an exemplary embodiment, referring to FIGS. 1A-1E, are shown cross sectional views of a portion of a multi-level semiconductor device at stages in an integrated circuit manufacturing process.

Figure 1A:
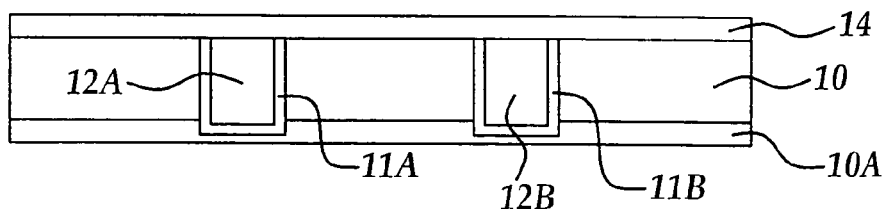
FIGS. 1A to 1E are cross-sectional views of a portion of a multi-layer semiconductor device at stages in a dual damascene manufacturing process according to an exemplary embodiment of the present invention.

Referring to FIG. 1A, conductive regions e.g., 12A, 12B, for example first trench lines including barrier layers e.g., 11A, 11B are formed in a dielectric insulating layer (first IMD layer) 10 including a first underlying first etch stop layer 10A. The conductive regions 12A and 12B may be formed by conventional processes including the etch stop layers and barrier layers or may be formed including the preferred etch stop layer and barrier layer materials outlined below for formation of an overlying dual damascene using two single damascene formation processes. The conductive regions 12A and 12B may be filled with one of copper, aluminum, or tungsten including alloys thereof and be the same or different metal used for filling the overlying dual damascene as explained below. It will be appreciated that conductive regions 12A and 12B may be formed to electrically connect with underlying conductive regions (not shown). In addition, the dielectric insulating layer 10 may be formed of conventional CVD or PECVD $SiO_2$, including dopants such as fluorine or may be formed of low-K materials such as CVD or PECVD carbon doped oxide or organo-silicate glass (OSG).

Still referring to FIG. 1A, a second etch stop layer 14 is formed over the conductive regions 12A and 12B, preferably having a thickness of less than about 500 Angstroms. The preferred materials for forming the second etch stop layer 14 are preferably formed by a PECVD process as explained below including at least one of silicon nitride (e.g., SiN), silicon carbide (e.g., SiC), oxygen doped silicon carbide (e.g., SiCO), and nitrogen doped silicon carbide (e.g., SiCN).

Figure 1B:
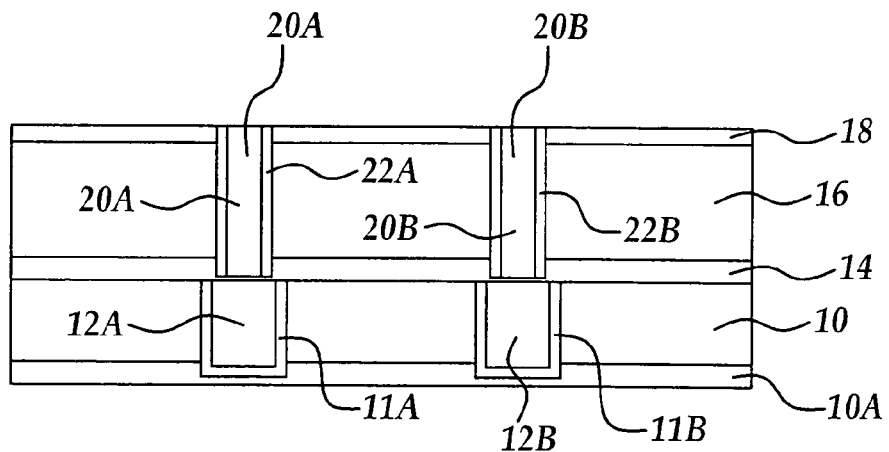

Referring to FIG. 1B, a second IMD layer 16 (via IMD) is formed over the second etch stop layer 14 by PECVD or CVD processes and may be formed of conventional CVD or PECVD $SiO_2$, including dopants such as fluorine (FSG) but is more preferably formed of low-K silicon oxide materials such as CVD or PECVD carbon doped oxide or organo-silicate glass (OSG), preferably having a dielectric constant less than about 3.0, more preferably less than about 2.7. The thickness of the second IMD layer is preferably sufficient to encompass a via portion of a dual damascene, for example from about 2000 Angstroms to about 5000 Angstroms.

Still referring to FIG. 1B, in an important aspect of the invention a third etch stop layer (trench etch stop layer) 18 is formed over the IMD layer 16 to a thickness less than about 300 Angstroms. The trench etch stop layer 18 is preferably formed of at least one of silicon nitride (e.g., SiN), silicon carbide (e.g., SiC), oxygen doped silicon carbide (e.g., SiCO), and nitrogen doped silicon carbide (e.g., SiCN). More preferably, the trench etch stop layer is formed of at least one of SiC, SiCO and SiCN, most preferably SiCO formed by a PECVD process outlined below.

In an exemplary PECVD process, SiCN is formed using an organo-silane precursor such as methyl silane and ammonia ($NH_3$), including an inert carrier or diluent gas such as He or Ar, more preferably He. Exemplary plasma operating conditions include precursor plasma source gas flow rates of 140-200 sccm for methyl silane, 300-500 sccm for He, and 300-350 sccm for NH3, a plasma deposition temperature of about 1 Torr to about 8 Torr, a deposition temperature of about 300° C. to about 400° C., and an RF power of about 100 Watts to about 500 Watts. Exemplary process conditions for forming SiCO include an organo-silane precursor such as methyl silane and ammonia ($CO_2$), including an inert carrier or diluent gas such as He or Ar, more preferably He. Exemplary plasma operating conditions include precursor plasma source gas flow rates of 140-200 sccm for methyl silane, 300-500 sccm for He, and 400-800 sccm for $CO_2$, a plasma deposition temperature of about 1 Torr to about 8 Torr, a deposition temperature of about 300° C. to about 400° C., and an RF power of about 100 Watts to about 500 Watts.

It will be appreciated that according to the present invention, the dual damascene formation method advantageously allows formation of a relatively thinner trench etch stop layer 18 compared to prior art processes, preferably less than about 300 Angstroms. For example, the trench etch stop layer is subjected to a reduced etching time in the dual damascene formation process of the present invention. In addition, it will be appreciated that an uppermost dielectric anti-reflectance coating (DARC) layer (not shown) is preferably formed prior to lithographically patterning the trench etch stop layer for forming vias. Via openings for forming vias 20A and 20B are then formed by conventional lithographic patterning, dry etching of openings followed by deposition of a via barrier layer at a first thickness to form via barrier layers 22A and 22B according to an aspect of the invention. The via openings are then backfilled with a metal, preferably copper, by a conventional electrochemical deposition (ECP) process, followed by planarization removing the via barrier layer above the trench etch stop layer to form vias 20A and 20B.

The via barrier layers e.g., 22A and 22B are preferably formed by a PECVD process including at least one of silicon nitride (e.g., SiN), silicon carbide (e.g., SiC), oxygen doped silicon carbide (e.g., SiCO), and nitrogen doped silicon carbide (e.g., SiCN), more preferably SiCO and SiCN, most preferably SiCN, formed by the same PECVD processes previously outlined for forming the trench etch stop layer 18. In an important aspect of the invention, the barrier layers 22A and 22B are preferably formed at a thickness less than about 500 Angstroms, more preferably less than about 300 Angstroms. For example, it has been found that PECVD deposition of SiC, SiCO or SiCN according to preferred embodiments allows significantly improved step coverage over the sidewalls and bottom portions of large aspect ratio openings, for example greater than about 4.0, more preferably greater than about 4.5, thereby allowing the formation of relatively thinner barrier layers compared to prior art barrier materials such as refractory metal nitrides such as TaN, In addition, according to the dual single damascene process to form a dual damascene according to an aspect of the invention, improved step coverage of the via barrier layer may be realized compared to prior art dual damascene processes allowing formation of relatively thinner barrier layers, preferably less than about 300 Angstroms, thereby reducing an RC delay time constant for signal propagation.

Figure 1C:
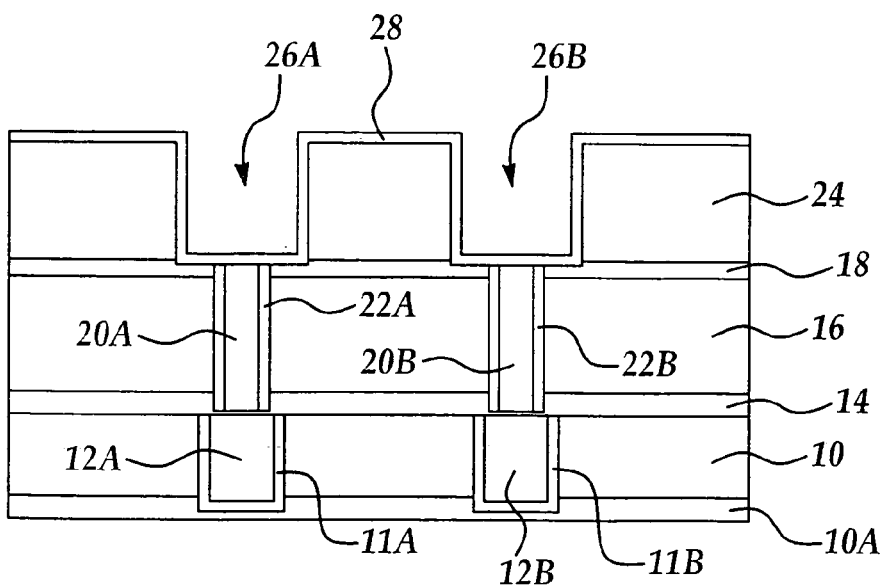

Referring to FIG. 1C, a third IMD layer (trench IMD layer) 24 is then deposited over the trench etch stop layer 18, using the same or different preferred materials outlined for forming the second IMD layer 16, but more preferably a low-K a PECVD organo-silicate glass (OSG) or carbon doped silicon oxide having a dielectric constant less than about 2.7, more preferably less than about 2.5. The low dielectric constant for the trench IMD layer 24 is preferred to reduce an RC signal delay contribution since the trench line IMD layer is relatively more important in RC signal delay contributions.

Still referring to FIG. 1C, trench line openings 26A, 26B are formed by conventional lithographic patterning and dry etching processes to expose the upper portion of the copper filled damascenes e.g., 20A and 20B including optionally etching through a thickness portion of the trench etch stop layer 18. Trench line barrier layers e.g., 28 is then deposited using the same preferred materials and processes outlined for the via barrier layers 22A and 22B. The trench line barrier layers e.g., 28 may be formed of the same or different material as the via barrier layers, most preferably SiCN, preferably at a thickness less than about 300 Angstroms. For example, the trench line barrier layers and the via barrier layers according to the dual damascene formation process according to the present invention may advantageously be formed at different thicknesses to optimize step coverage while reducing a capacitance contribution. For example, the trench line barrier layers may be formed with a thickness less than the via barrier layers to achieve improved step coverage within the high aspect ratio via opening while reducing a capacitance contribution in the trench line. It will be appreciated that the trench line barrier layers may be formed with a greater thickness than the via barrier layers as well, for example when a more robust layer is desired for the trench lines to prevent undesired copper electromigration.

Figure 1D:
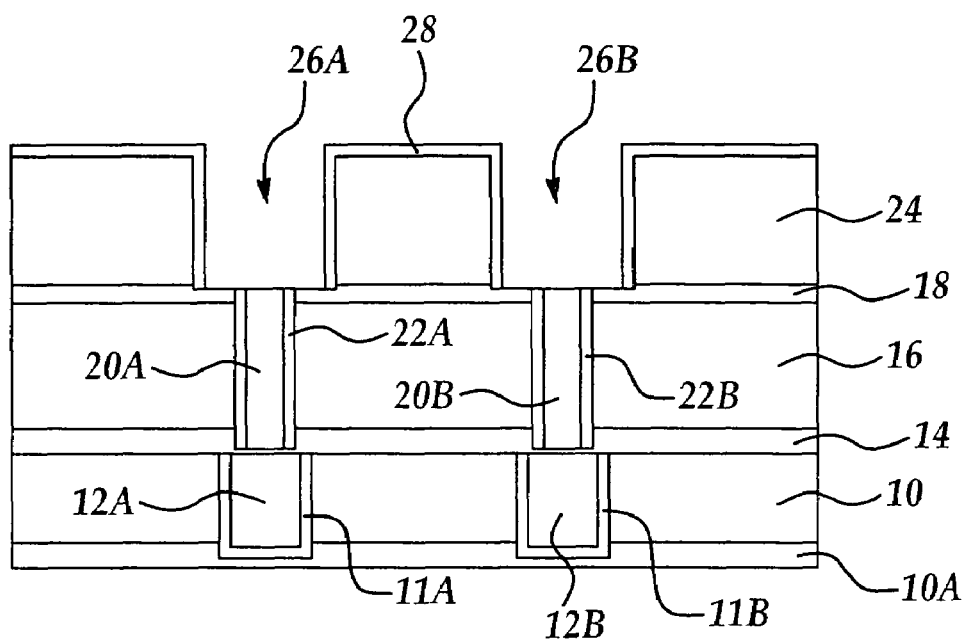

Referring to FIG. 1D, following trench line barrier layer 28 formation, a conventional dry etchback process is carried out to remove the trench line barrier layer over the bottom portions of the trench line openings, 26A, 26B, to leave the barrier layer 28 covering the sidewalls of the trench line openings 26A and 26B.

Figure 1E:
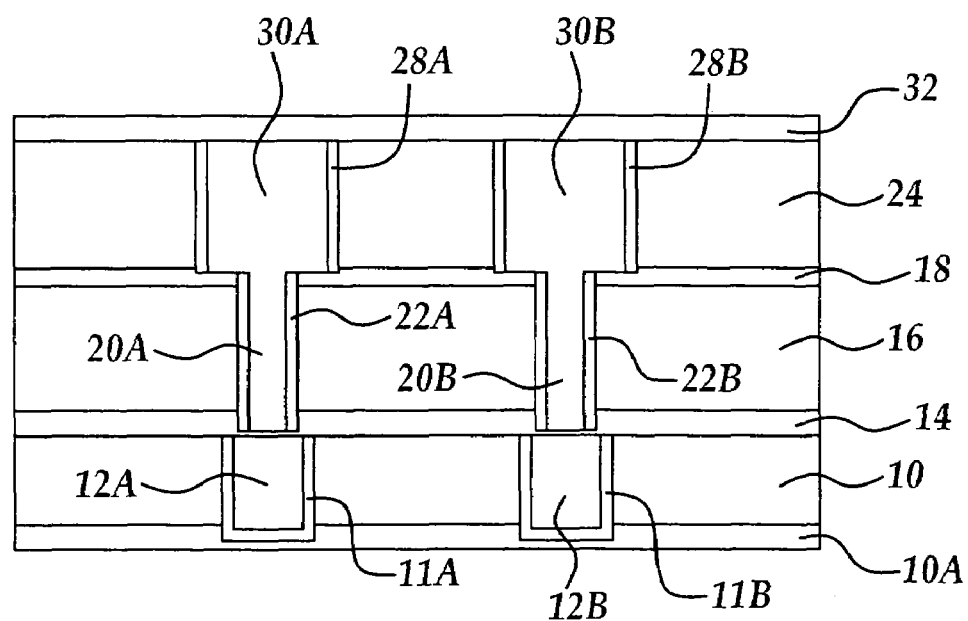

Referring to FIG. 1E, a conventional copper ECP process is then carried out including first depositing a copper seed layer followed by copper ECP deposition to fill the trench line openings and a multi-step CMP process to remove excess copper overlying the opening level including the barrier layer 28 portion over the process surface leaving barrier layer portions e.g., 28A and 28B lining the sidewalls of the metal filled trench lines e.g., 30A and 30B. Another etch stop layer 32 may then be formed over the process surface using the same preferred materials and thicknesses outlined for the second etch stop layer 14 is begin the formation of an overlying metallization level.

Thus a method for forming a dual damascene has been presented where the via portion and the trench line portion are each formed by single damascene process where barrier layers in the respective portions may be formed at different thicknesses including different preferred barrier layer materials to optimize a step coverage while minimizing a capacitance contribution. In addition, the trench etch stop barrier layer may advantageously be formed at smaller thickness compared to the via barrier layer according the present invention, to further reduce capacitance contributions. The method of the present invention is particularly advantageous in forming dual damascenes in semiconductor devices with characteristic dimensions less than about 90 nm and where via aspect ratios are greater than about 4.5.

Figure 2:
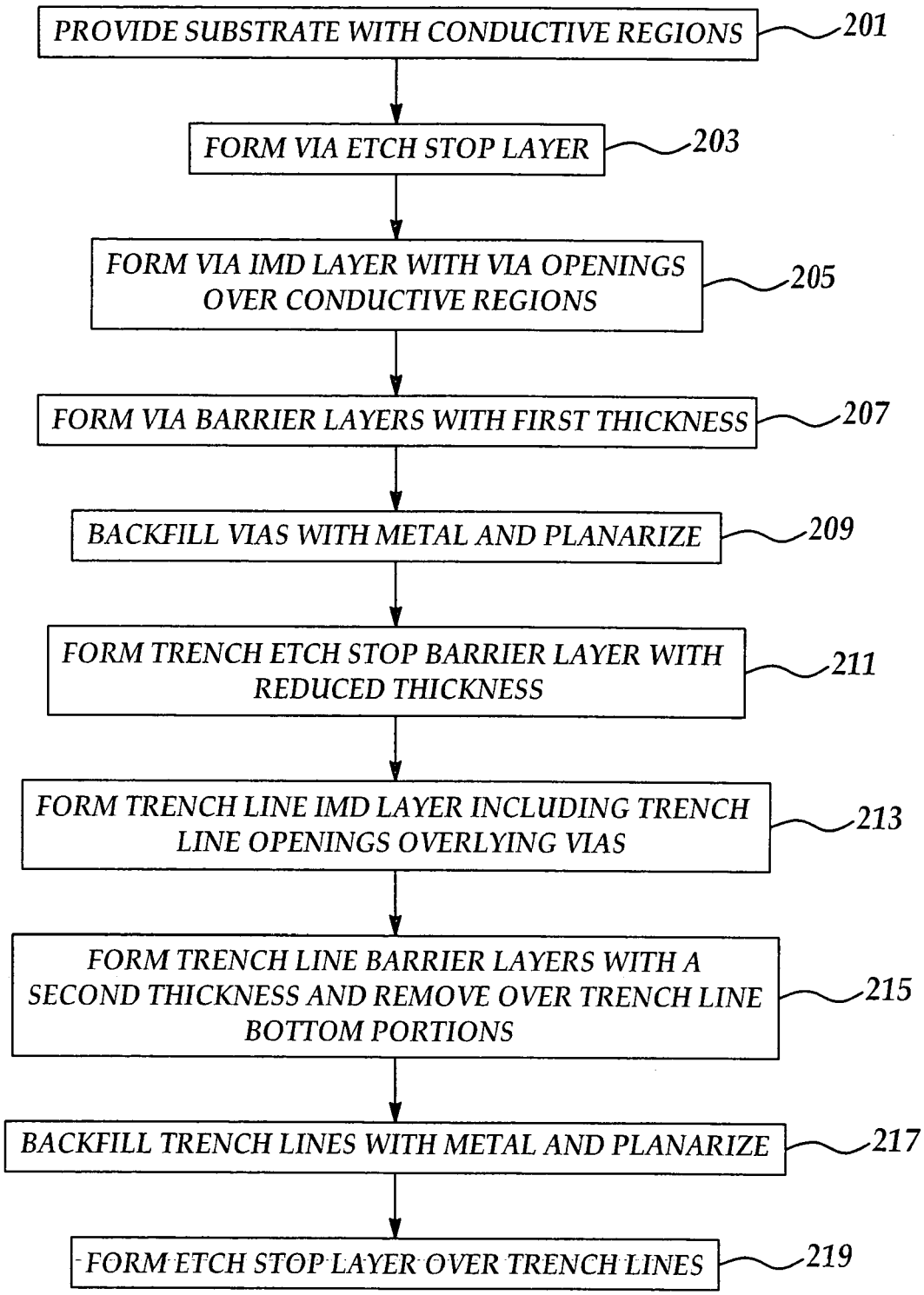
FIG. 2 is a process flow diagram according including several embodiments of the present invention.

Referring to FIG. 2 is a process flow diagram including several embodiments of the present invention. In process 201, a substrate is provided with conductive regions. In process 203, a via etch stop layer is formed over the conductive regions. In process 205, a via IMD layer is formed over the first etch stop layer and via openings are formed in the via IMD layer over the conductive regions. In process 207, via barrier layers are formed to line the via openings at a first thickness according to preferred embodiments. In process 209, the via openings are backfilled with metal and planarized. In process 211, a trench line etch stop barrier layer is deposited with a reduced thickness over the vias according to preferred embodiments. In process 213, a trench IMD layer is formed over the trench etch stop layer and trench line openings are formed in the trench IMD layer overlying the vias. In process 215, trench line barrier layers are formed to line the trench line openings at a second thickness and removed over the bottom portion of the trench line openings according to preferred embodiments. In process 217, the trench lines are backfilled with metal and planarized including removing the trench line barrier layer over the process surface to form dual damascenes. In process 219, an etch stop layer is formed over the trench lines to begin formation of another metallization level in a multi-level semiconductor device.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a metal filled dual damascene structure comprising the steps of:
   forming a first metal filled damascene in a first dielectric layer, said first metal filled damascene is a via lined with a first barrier layer having a first thickness; and,
   then forming a second metal filled damascene in a second dielectric insulating layer, said second metal filled damascene lined with a second barrier layer having a second thickness different from said first thickness, wherein the first barrier layer thickness is less than the second barrier layer thickness and wherein said second metal filled damascene overlies the first metal filled damascene to form a dual damascene structure.

2. The method of claim 1, wherein the second metal filled damascene is a trench line.

3. The method of claim 1, wherein the first and second barrier layers comprise a material selected from the group consisting of silicon nitride, silicon carbide, oxygen doped silicon carbide, nitrogen doped silicon carbide, and combinations thereof.

4. The method of claim 1, wherein the first and second barrier layers are formed of different materials.

5. The method of claim 1, wherein the first and second barrier layers consist essentially of nitrogen doped silicon carbide.

6. The method of claim 1, wherein the metal comprises copper or alloys thereof.

7. The method of claim 1, wherein the first and second dielectric layers comprise a material selected from the group consisting of silicon oxide, doped silicon oxide, fluorinated silicate glass (FSG), carbon doped silicon oxide, and organo-silicate glass (OSG).

8. The method of claim 1, wherein the second dielectric layer has a dielectric constant of less than about 2.7.

9. The metal filled dual damascene of claim 1, wherein at least one of the first and second barrier layers comprise nitrogen doped silicon carbide.

10. The method of claim 1, further comprising a trench etch stop layer formed between the first and second dielectric layers.

11. The method of claim 10, wherein the trench etch stop layer comprises a material selected from the group consisting of silicon nitride, silicon carbide, oxygen doped silicon carbide, and nitrogen doped silicon carbide.

12. The method of claim 10, wherein the second metal filled damascene comprises a bottom portion extending through a thickness portion of the trench etch stop layer.

13. The method off claim 10, wherein the trench etch stop layer has a thickness of less than about 300 Angstroms.

14. The method of claim 10, wherein the second barrier layer is absent over the second metal filled damascene bottom portion.

15. A method for forming a dual damascene structure with a reduced capacitance contribution comprising the steps of:
   forming a metal filled via in a first dielectric layer, said metal filled via lined with a first barrier layer having a first thickness
   forming a second dielectric layer over the first dielectric insulating layer;

then forming a trench line opening in the second dielectric layer over the metal filled via, said trench line opening lined with a second barrier layer, said second barrier layer having a thickness less than said first barrier layer;

wherein said first barrier layer lining said via and said second barrier layer lining said trench line opening are selected from the group consisting of silicon nitride, silicon carbide, oxygen doped silicon carbide, nitrogen doped silicon carbide, and combinations thereof;

removing the second barrier layer over the trench line opening bottom portion; and, filling the trench line opening with a metal and planarizing to define a dual damascene.

16. The method of claim 15, wherein the first and second barrier layers consist essentially of nitrogen doped silicon carbide.

17. The method of claim 15, wherein the first and second dielectric layers comprise a material selected from the group consisting of silicon oxide, doped silicon oxide, fluorinated silicate glass (FSG), carbon doped silicon oxide, and organo-silicate glass (OSG)

18. The method of claim 15, wherein the second dielectric layer has a dielectric constant of less than about 2.7.

19. The method of claim 15, further comprising the step of forming a trench etch stop layer on the first dielectric insulating layer prior to the step of forming a trench line opening.

20. The metal filled dual damascene of claim 15, wherein at least one the first and second barrier layers comprise nitrogen doped silicon carbide.

21. The method of claim 16, further comprising the step of forming a trench etch stop layer on the first dielectric insulating layer prior to forming the second dielectric insulating layer, said trench etch stop layer comprising a material selected from the group consisting of silicon nitride, silicon carbide, oxygen doped silicon carbide, nitrogen doped silicon carbide, and combinations thereof.

22. The method of claim 21, wherein the trench line opening extends through a thickness portion of the trench etch stop layer.

23. The method of claim 21 wherein the trench etch stop layer has a thickness of less than about 300 Angstroms.

24. A metal filled dual damascene structure comprising:
a first metal filled damascene in a first dielectric insulating layer, said first metal filled damascene lined with a non-metal first barrier layer having a first thickness; and,
a second metal tilled damascene in a second dielectric layer, said second metal filled damascene lined with a second non-metal barrier layer having a second thickness, said first thickness less than said second thickness; said first and second barrier layers are formed of different materials;
wherein said second metal filled damascene overlies the first metal filled damascene to form a dual damascene structure.

25. The metal filled dual damascene of claim 24, wherein the first metal filled damnascene is a via.

26. The metal filled dual damascene of claim 24, wherein the second metal filled damascene is a trench line.

27. The metal tilled dual damascene of claim 24, wherein the first and second barrier layers comprise A material selected from the group consisting of silicon nitride, silicon carbide, oxygen doped silicon carbide, and nitrogen doped silicon carbide.

28. The metal filled dual damascene of claim 24, wherein the first and second barrier layers consist essentially of nitrogen doped silicon carbide.

29. The metal filled dual damascene of claim 24, wherein the second barrier layer is absent over a bottom portion comprising the second metal filled damascene.

30. The metal filled dual damascene of claim 24, wherein the metal comprises copper or alloys thereof.

31. The metal filled dual damascene of claim 24, wherein the first and second dielectric layers comprise a material selected from the group consisting of silicon oxide, doped silicon oxide, fluorinated silicate glass (FSG), carbon doped silicon oxide, organo-silicate glass (OSG), and combination thereof.

32. The metal filled dual damascene of claim 24, wherein the second dielectric layer has a dielectric constant of less than about 2.7.

33. The metal filled dual damascene of claim 24, wherein at least one the first and second barrier layers comprise nitrogen doped silicon carbide.

34. The metal filled dual damascene of claim 24, further comprising a trench etch stop layer interposed between the first and second dielectric layers.

35. The metal filled dual damascene of claim 34, wherein the trench etch stop layer comprises a material selected from the group consisting of silicon nitride, silicon carbide, oxygen doped silicon carbide, nitrogen doped silicon carbide, and combination thereof.

36. The metal filled dual damascene of claim 34, wherein the second metal filled damascene comprises a bottom portion extending through a thickness portion of the trench etch stop layer.

37. The metal filled dual damascene of claim 34, wherein the trench etch stop layer has a thickness of less than about 300 Angstroms.

* * * * *